(12) United States Patent
Ulavi et al.

(10) Patent No.: US 11,791,190 B2
(45) Date of Patent: Oct. 17, 2023

(54) APPARATUS AND METHODS FOR REAL-TIME WAFER CHUCKING DETECTION

(71) Applicant: Applied Materials, Inc., Santa Clara, CA (US)

(72) Inventors: Tejas Ulavi, San Jose, CA (US); Arkaprava Dan, San Jose, CA (US); Mike Murtagh, Santa Clara, CA (US); Sanjeev Baluja, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 243 days.

(21) Appl. No.: 17/314,714

(22) Filed: May 7, 2021

(65) Prior Publication Data

US 2021/0351060 A1    Nov. 11, 2021

Related U.S. Application Data (60) Provisional application No. 63/022,442, filed on May 9, 2020.

(51) Int. Cl.
*H01L 21/683* (2006.01)
*H02N 13/00* (2006.01)
*G01R 27/26* (2006.01)
*H01L 21/67* (2006.01)

(52) U.S. Cl.
CPC ...... *H01L 21/6833* (2013.01); *G01R 27/2605* (2013.01); *H01L 21/67242* (2013.01); *H02N 13/00* (2013.01)

(58) Field of Classification Search
CPC .......... H01L 21/6833; H01L 21/67242; G01R 27/2605; H02N 13/00
See application file for complete search history.

(56) References Cited

U.S. PATENT DOCUMENTS

| | | | |
|---|---|---|---|
| 6,377,060 B1 | 4/2002 | Burkhart et al. | |
| 2001/0024349 A1* | 9/2001 | Shamoulian | H02N 13/00 29/843 |
| 2003/0194493 A1* | 10/2003 | Chang | C23C 16/45519 156/345.31 |
| 2013/0003250 A1* | 1/2013 | Morimoto | H01L 21/6831 361/234 |
| 2019/0066982 A1 | 2/2019 | Sato et al. | |
| 2020/0090978 A1 | 3/2020 | Aubuchon et al. | |

FOREIGN PATENT DOCUMENTS

| | | |
|---|---|---|
| JP | 2001332609 A | 11/2001 |
| JP | 2020053606 A | 4/2020 |

OTHER PUBLICATIONS

PCT International Search Report and Written Opinion in PCT/US2021/031319 dated Aug. 30, 2021, 11 pages.

* cited by examiner

*Primary Examiner* — Scott Bauer
(74) *Attorney, Agent, or Firm* — Servilla Whitney LLC (57) ABSTRACT

Substrate supports, substrate support assemblies and methods of using the substrate supports are described. The substrate support has a support surface with at least two electrodes and a plurality of purge channels bounded by a seal band. A power supply connected to the electrodes configured as an electrostatic chuck. A capacitance of the substrate is measured while on the substrate support to determine the chucking state of the substrate.

17 Claims, 9 Drawing Sheets

APPARATUS AND METHODS FOR REAL-TIME WAFER CHUCKING DETECTION

CROSS-REFERENCE TO RELATED APPLICATIONS

This application claims priority to U.S. Provisional Application No. 62/022,442, filed May 9, 2020, the entire disclosure of which is hereby incorporated by reference herein.

TECHNICAL FIELD

Embodiments of the present disclosure generally relate to apparatus and methods for processing substrates. In particular, embodiments of the disclosure are directed to apparatus and methods for the real-time determination and monitoring of wafer chucking on one or more substrates support surfaces.

BACKGROUND

In some batch processing systems, multiple substrates are moved within a processing chamber at high velocity. The accelerations and decelerations of the substrate often lead to misalignment of the substrate. In some multi-wafer spatial atomic layer deposition (ALD) processing tools, wafers move between process stations for each half cycle at a peak acceleration of 2.5 g over 60 cycles or more, to potentially hundreds of cycles.

To hold a substrate in a fixed position, substrates can be electrostatically chucked to the substrate support. However, the extreme speed changes in modern batch processing chambers can lead to movement of the substrate on the substrate support and eventually to a loss of chucking.

In several semiconductor process flows, the spatial ALD chamber is used to deposit conductive films on substrates. When the precursor chemistries for these films are insufficiently purged, residual precursor species can react on the substrate support and form a conductive film, which can degrade the electrostatic chucking performance of the support.

Additionally, many processing systems and processing tools operate with very tight space requirements. For example, a multi-wafer ALD chamber can process with 0.8 to 3 mm between the substrate surface and the gas distribution system. These small spaces minimize chemistry consumption by reducing process volume, minimize ALD cycle time and purge time and maximize throughput.

Several semiconductor process flows involve the substrate having a 0.2-0.8 mm or larger bow, as opposed to a flat substrate. If the substrate is not flattened prior to processing at close gaps, the surface area of the substrate in contact with the substrate support is low, which can lead to reduced chucking force, and also uneven heating of the substrate.

A loss of wafer chucking can lead to critical failures on chamber components and result in significant loss of productivity. A loss of chucking could cause a wafer to be thrown with tremendous force from the substrate support. The wafer could strike any number of components within the processing chamber causing damage. The process chamber would need to be repaired and the substrate would be a loss.

Therefore, there is a need in the art for apparatus and methods to monitor the chucking state of a wafer during processing.

SUMMARY

One or more embodiments of the disclosure are directed to substrate supports comprising a body connected to a support post. The body has a support surface and a bottom surface. The distance between the support surface and the bottom surface define the thickness of the body. The support surface has a plurality of purge channels extending a distance into the body. The plurality of purge channels is bounded by a seal band. The body includes at least two electrodes configured to electrostatically chuck a substrate to the support surface. The support post is connected to the bottom surface of the body. A purge line is in fluid communication with the purge channels. A power supply is connected to the electrodes. A controller is connected to the electrodes and configured to measure capacitance of a substrate on the support surface.

Additional embodiments of the disclosure are directed to substrate support assemblies comprising a central hub that is rotatable around a rotational axis. A plurality of substrate supports are position at a distance from the rotational axis. Each of the substrate supports comprises a support surface and a bottom surface. The distance between the support surface and the bottom surface define the thickness of the body. The support surface has a plurality of purge channels extending a distance into the body. The plurality of purge channels is bounded by a seal band. The body includes at least two electrodes configured to electrostatically chuck a substrate to the support surface. The support post is connected to the bottom surface of the body. A purge line is in fluid communication with the purge channels. A power supply is connected to the electrodes. A controller is connected to the electrodes and configured to measure capacitance of a substrate on the support surface.

Further embodiments of the disclosure are directed to processing methods comprising providing a flow of purge gas into a plurality of purge channel formed in a support surface of a body of a substrate support. The plurality of purge channels is bounded by a seal band. The substrate support has a substrate positioned thereon and the flow of gas leaking through the seal band. At least two electrodes formed in the body of the substrate support are polarized so that there is a voltage differential between the at least two electrodes to electrostatically chuck the substrate to the support surface. A capacitance of the substrate on the substrate support is measured to determine whether the substrate is chucked.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure advantageously provide for the real-time detection of wafer flatness, chucking force, chuck surface conditions, clean end-point monitoring, etc. Some embodiments advantageously provide sensors to improve wafer handling robustness in batch processing chambers. Some embodiments of the disclosure provide a combination of capacitance sensors and back side pressure measurements to improve the sensitivity of wafer chucking detection. Some embodiments allow for the detection of wafer flatness and/or real-time chucking/de-chucking detection.

Some embodiments of the disclosure use a wafer backside pressure (BSP) control to detect whether a wafer is chucked flat. Some embodiments use BSP to measure the chucking force of a wafer.

One or more embodiments of the disclosure combine both electrostatic chuck capacitance and back side pressure measurements to detect conditions that cannot be monitored by a single sensor arrangement. Some embodiments of the disclosure provide apparatus and methods to detect degradation in chucking performance or pedestal surface contamination.

Figure 1:
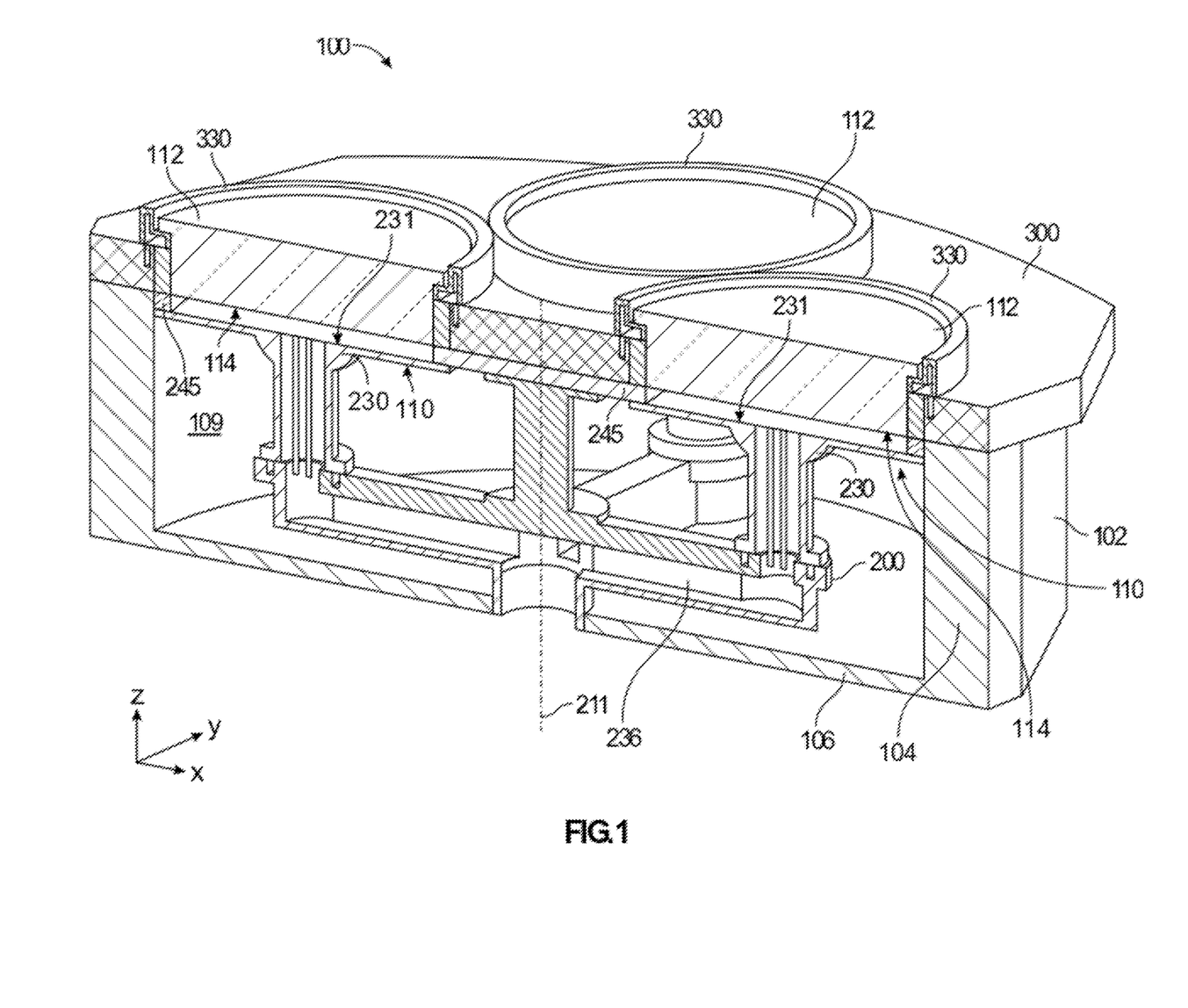
FIG. 1 shows a cross-sectional isometric view of a processing chamber in accordance with one or more embodiment of the disclosure.
Figure 2:
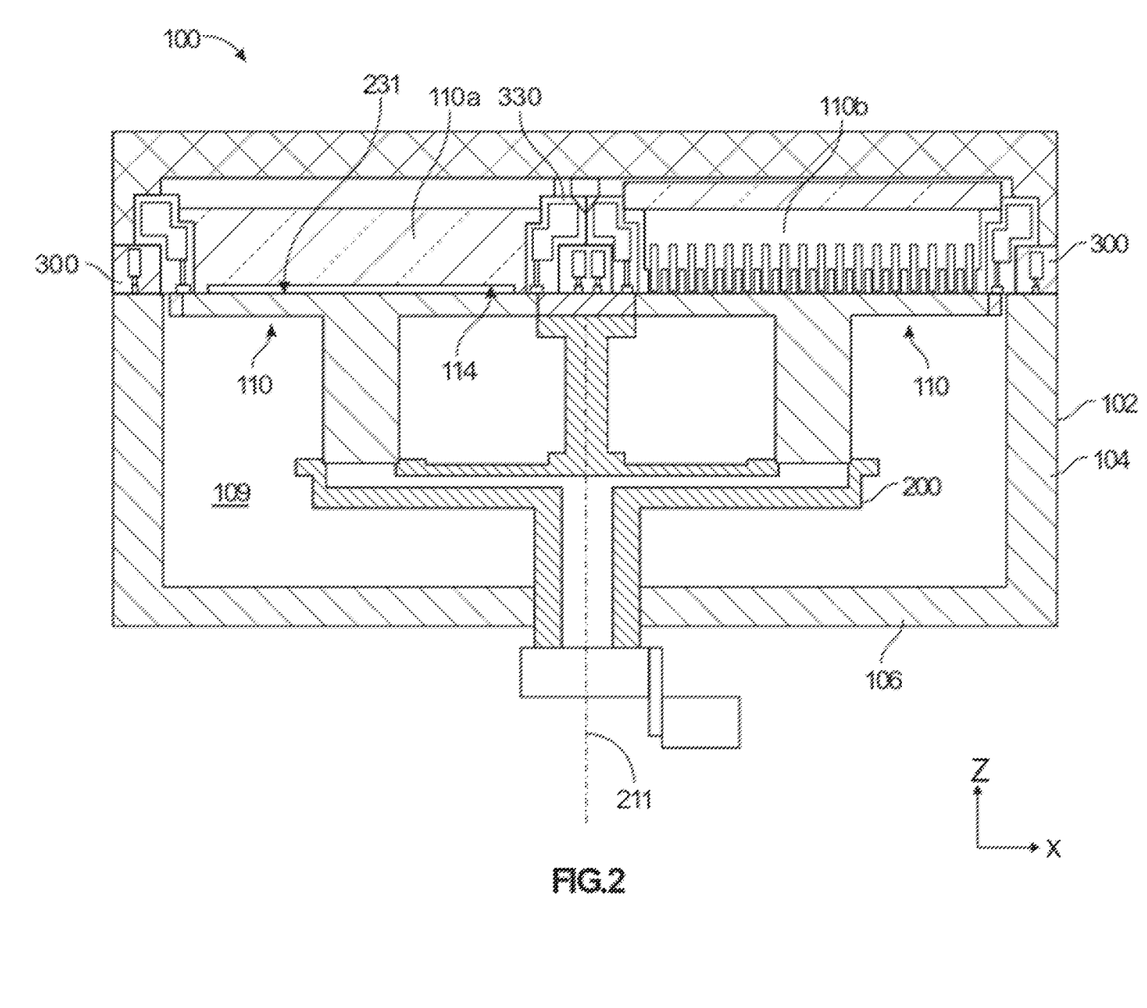
FIG. 2 shows a cross-sectional view of a processing chamber in accordance with one or more embodiment of the disclosure.

The disclosure provides substrate supports for use with single wafer or multi-wafer (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200.

The processing chamber 100 has a housing 102 with walls 104 and a bottom 106. The housing 102 along with the top plate 300 define a processing volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
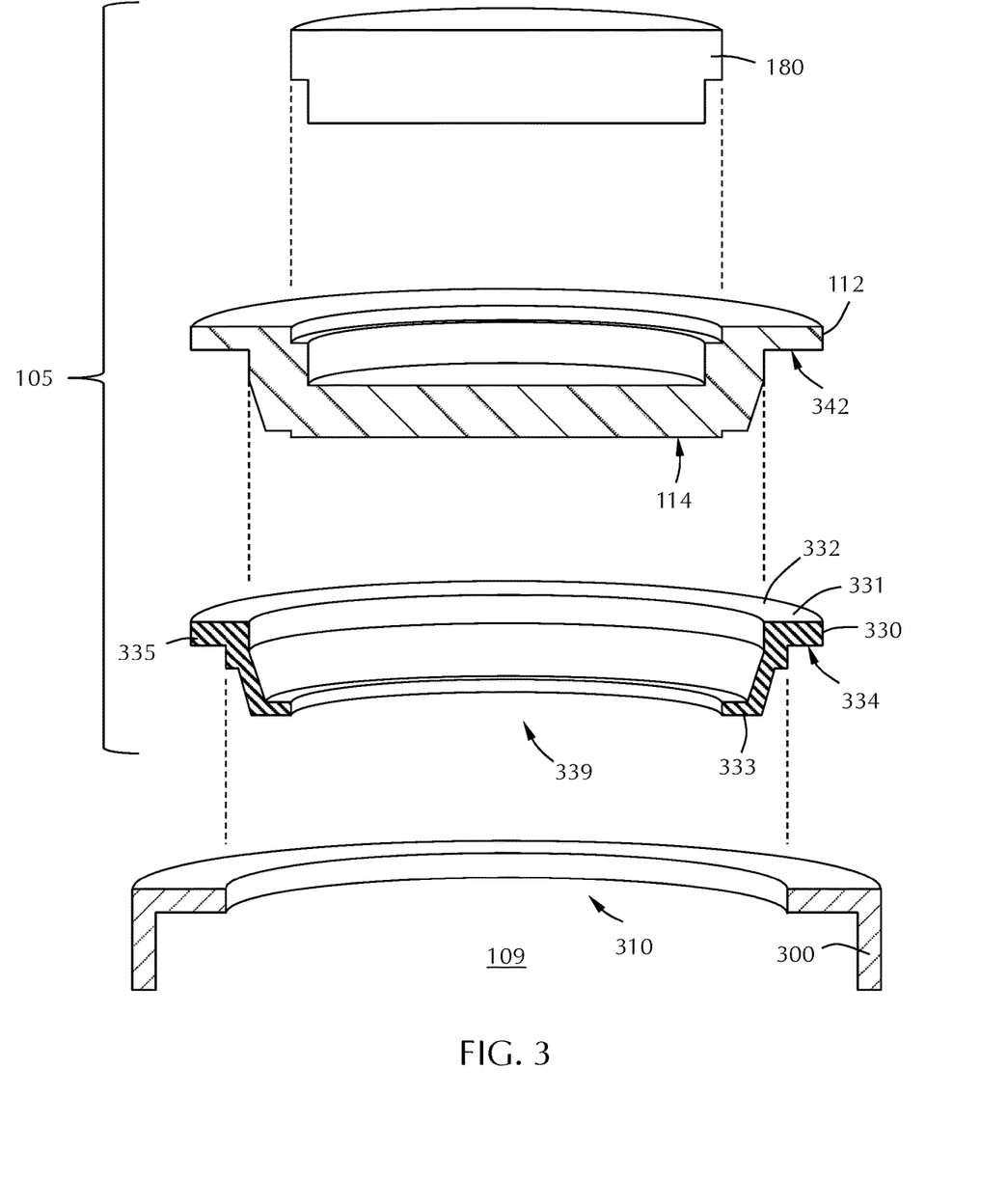
FIG. 3 is an exploded cross-sectional view of a processing station in accordance with one or more embodiment of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas injectors 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 is configured to be positioned in the opening 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas injectors 112 of various types to be used within the same opening 310 in the top plate 300.

Figure 4:
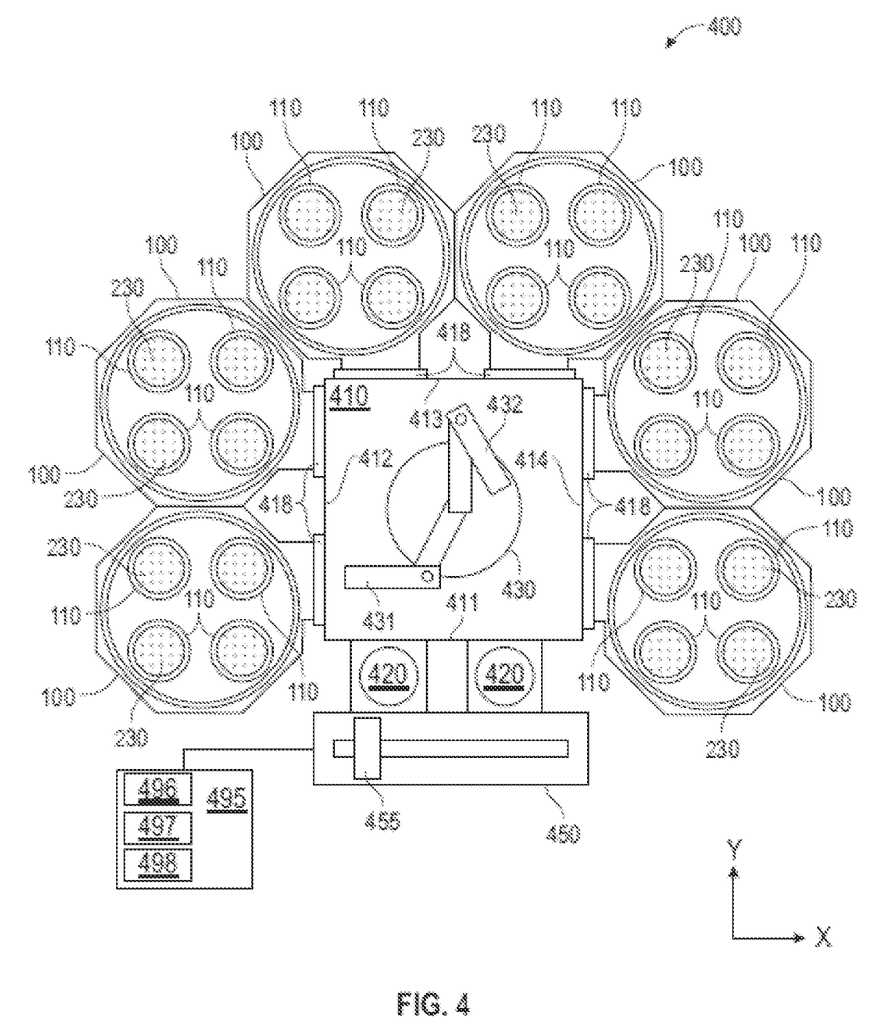
FIG. 4 is a schematic representation of a processing platform in accordance with one or more embodiment of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

Figure 5:
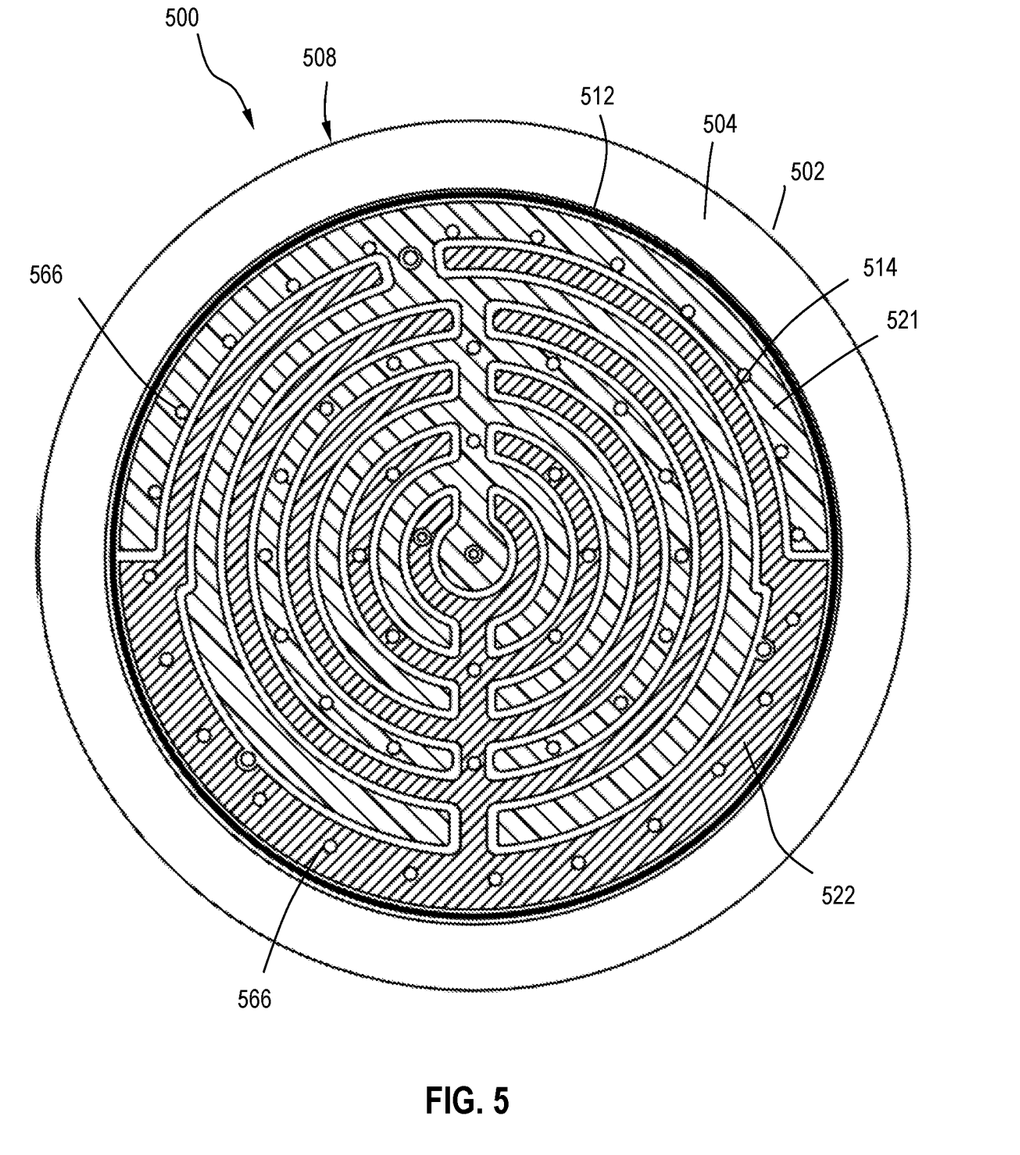
FIG. 5 is a schematic view of a substrate support according to one or more embodiment of the disclosure.
Figure 6:
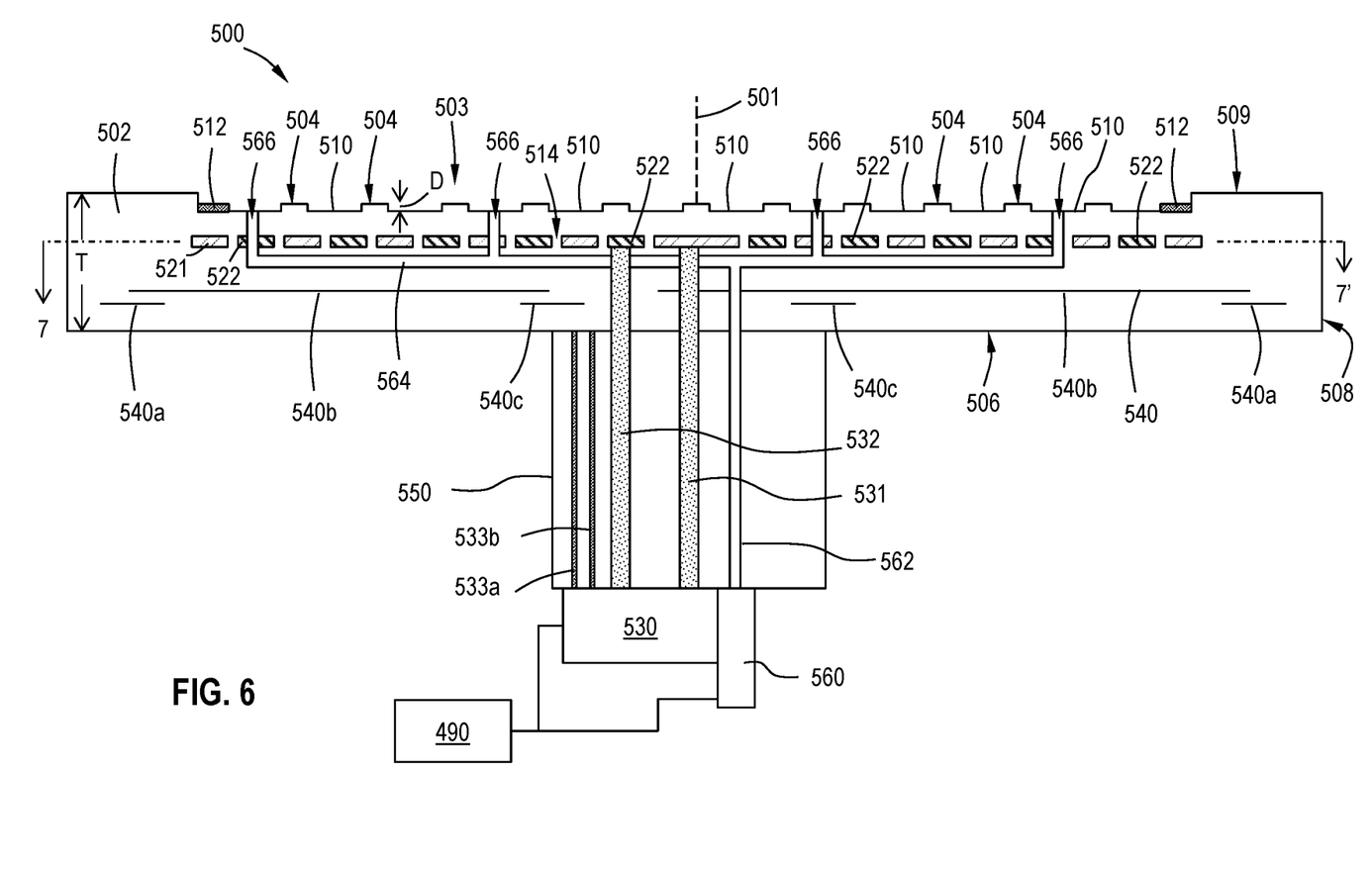
FIG. 6 is a partial cross-sectional schematic view of a substrate support according to one or more embodiment of the disclosure.

FIGS. 5 and 6 illustrate a substrate support 500 in accordance with one or more embodiments of the disclosure. FIG. 5 illustrates a schematic top view of a substrate support 500 showing some inside components. FIG. 6 illustrates a cross-sectional schematic view of a substrate support 500. The embodiments illustrated in FIGS. 5 and 6 are merely representative of possible configurations and should not be taken as limiting the scope of the disclosure.

The substrate supports 500 have a body 502 with a support surface 504 and a bottom surface 506. The distance between the support surface 504 and bottom surface 506 define the thickness T of the body 502. The substrate support 500 of some embodiments has a round profile with an outer peripheral face 508.

The support surface 504 has a plurality of purge channels 510 extending a distance or depth D into the body 502. The purge channels 510 can be seen in FIG. 6 and are omitted from FIG. 5 for descriptive purposes. The depth D that the purge channels 510 extend into the body 502 of some embodiments is in the range of 0.005 mm to 1 mm, or in the range of 0.01 mm to 0.5 mm, or in the range of 0.015 mm to 0.5 mm.

The plurality of purge channels 510 are bounded around an outer edge (relative to a rotational axis 501) by a seal band 512. In some embodiments, the seal band 512 is a generally circular shape (which can be solid or broken) with an inner diameter slightly smaller than the diameter of a substrate to be processed. For example, the seal band 512 for a 300 mm substrate in some embodiments has an inner diameter smaller than 298 mm. In some embodiments, the seal band 512 has a height measured from the support surface 504 in the range of 0.005 mm to 1 mm, or in the range of 0.01 mm to 0.5 mm, or in the range of 0.015 mm to 0.5 mm. In some embodiments the seal band has the same height as the depth of the purge channels (coplanar with support surface 504).

Figure 6A:
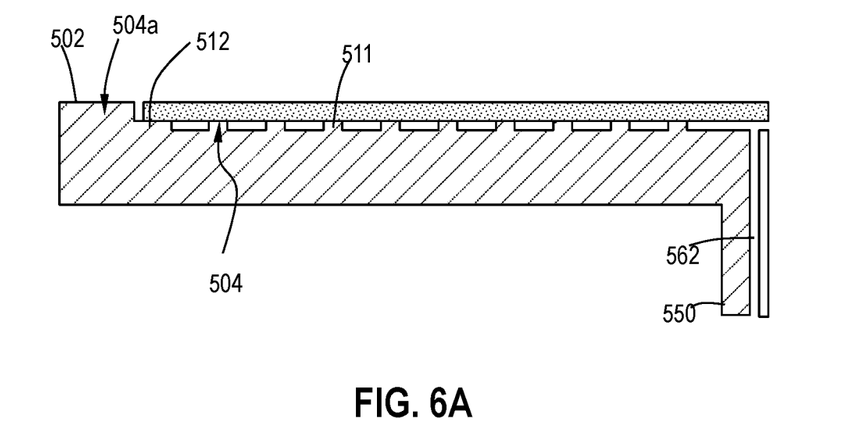
FIG. 6A is a partial cross-sectional schematic view of a substrate support according to one or more embodiment of the disclosure.

In some embodiments, as shown in FIG. 6A, the portion 504a of the support surface 504 outside of the outer diameter of the seal band 512 is higher than the support surface 504. The illustrated embodiment has a substrate support 500 (also referred to as the electrostatic chuck or ESC) comprising mesas 511 or dimples on a flat surface. The wafer sits on the mesas 511 and the seal band 512 and is surrounded, at least in part, by the outer portion 504a of the body 502. The mesas 511 and the seal band 512 in some embodiments have the same height. In some embodiments, the mesas and seal band have different heights. The mesas of some embodiments have a diameter of about 1 mm. A purge gas (e.g., helium) fills the gap between the wafer and the flat surface as it rests on the mesas and seal band. In the embodiment shown, the open areas below the wafer are purge gas channels.

In some embodiments, the substrate support 500 is an electrostatic chuck, as illustrated schematically in FIGS. 5 and 6. In some embodiments, the body 502 includes at least two electrodes 521, 522 configured to electrostatically chuck a substrate to the support surface 504. The electrodes 521, 522 can be made of any suitable conductive material known to the skilled artisan.

The embodiment illustrated has two electrodes 521, 522 separated by a dielectric 514. The dielectric 514 of some embodiments is the same material as the body 502. In some embodiments, the dielectric comprises aluminum oxide ($Al_2O_3$, also referred to as AlO) or aluminum nitride (AlN).

FIG. 5 shows the first electrode 521 intertwined with the second electrode 522 in a finger-joint like pattern. The shape of the electrodes can be any suitable shape and is not limited to the finger-joint like pattern shown in FIG. 5. The shape and pattern of the electrodes may impact the chucking force that can be applied to a substrate. In general, and without being bound by any particular theory of operation, it is believed that a larger surface area separating the electrodes 521, 522 will result in a stronger chucking force, which may also allow for less power consumption.

A power supply 530 is connected to the electrodes 521, 522 to generate the voltage differential between the electrodes 521, 522. The power supply 530 connects through transmission lines 531, 532 to the electrodes 521, 522. The transmission lines 531, 532 are electrically separated by any suitable insulator to prevent shorting or arcing.

The power supply 530 of some embodiments provides a first voltage (also referred to as potential) to the electrode 521 and a second voltage to the electrode 522 that is different from the first voltage. In some embodiments, the power supply 530 is configured to provide high voltage direct current (DC) and a low voltage alternating current (AC) component to the electrodes 521, 522.

In one or more embodiments of the disclosure, the power supply 530 includes or is connected to a capacitance sensor 535. In some embodiments, the capacitance sensor 535 is a separate sensor within the body 502 of the substrate support 500, as shown in FIG. 6. In some embodiments, the capacitance sensor is a part of the electronics of the power supply 530.

In some embodiments, the body 502 further comprises at least one heating element 540 within the thickness T of the body 502. The embodiment illustrated in FIG. 6 shows three heating elements 540a, 540b, 540c spaced at different radii and at different positions along the rotational axis 501. The embodiment shows an outer zone 540a and an inner zone 540c on a first level in the body 502, and a center zone 540b on a second level in the body 502 closer to the support surface 504. The skilled artisan will recognize that the number and positioning of heating elements in the illustrated embodiment is merely one possible configuration and should not be taken as limiting the scope of the disclosure.

The substrate support 500 includes a support post 550 connected to the bottom surface 506 of the body 502. The support post 550 of some embodiments is hollow to contain the transmission lines 531, 532 and any other connections or conduits (e.g., a purge gas conduit or plenum). In some embodiments, the support post 550 is a generally solid body with openings to house the transmission lines 531, 532 and any other connections or conduits.

A purge line 562 is in fluid communication with the purge channels 510 formed in the support surface 504. The purge line 562 of some embodiments is connected to a purge gas source 560 to allow a purge gas to flow from the purge gas source 560 to the purge channels 510 through the purge line 562. In some embodiments, the support post 550 includes a plenum or cavity along the length of the purge line 562. In some embodiments, as illustrated, the purge line 562 connects to a second leg 564 of the purge line 562 to split the flow of purge gas into the different openings 566 in the purge channels 510. In some embodiments, the purge line 562 provides a flow of purge gas to the backside of a substrate positioned on the support surface 504. This is also referred to as a backside purge.

Some embodiments of the disclosure include a controller 590 connected to the electrodes 521, 522. The controller 590 of some embodiments is configured to measure capacitance of a substrate on the support surface 504. In some embodiments, the controller 590 is configured to continuously measure the capacitance of a substrate on the support surface 504 through processing. In some embodiments, the controller is configured to stop the process upon a change in capacitance outside an allowable range.

Figure 7:
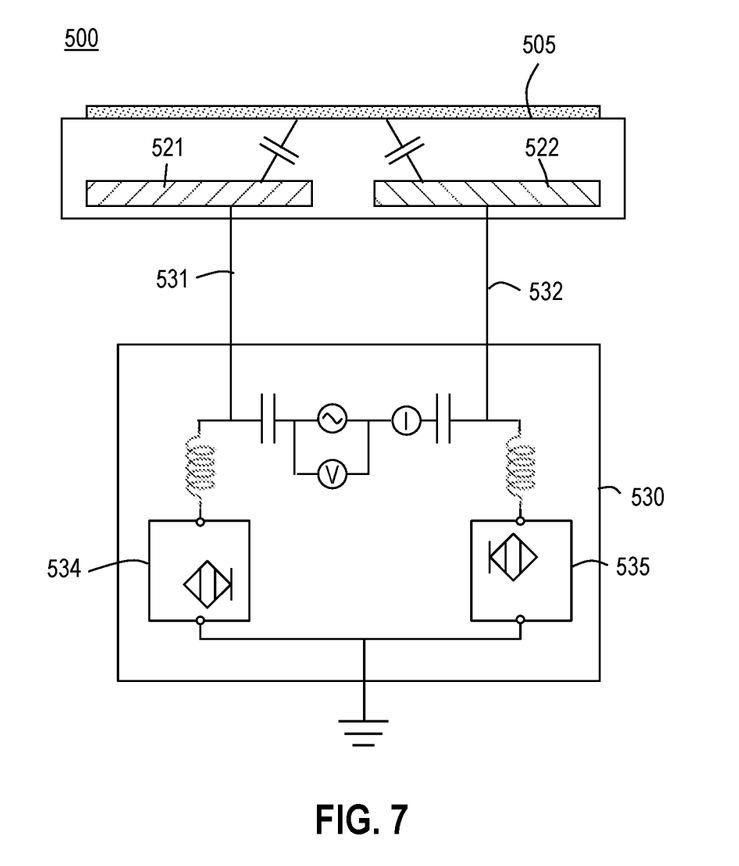
FIG. 7 is a schematic view of an electrostatic chuck and power system according to one or more embodiment of the disclosure.

FIG. 7 illustrates a schematic representation of a substrate support 500 body 502 with a substrate 505 thereon. The illustrated embodiment is a bi-polar electrostatic chuck; however, the skilled artisan will recognize that the disclosure is not limited to bi-polar echucks. Electrodes 521, 522 are within the body 502 and are connected by transmission lines 531, 532 to power supply 530. The power supply 530 provides high voltage DC power 534, 535 to the electrodes 521, 522. In some embodiments, the high voltage direction current (DC) power is in the range of ±1500 volts, or in the range of ±1000 volts, or in the range of ±750 volts, or in the range of ±500 volts, or in the range of ±250 volts.

A relatively small alternating current (AC) is superimposed to the DC high-voltage signal. The AC component allows the capacitance of the electrostatic chuck circuit to be measured. In some embodiments, the AC component has a voltage in the range of 1 volt to 100 volts, or in the range of 2 volts to 90 volts, or in the range of 3 volts to 80 volts, or in the range of 4 volts to 70 volts, or in the range of 5 volts to 60 volts, or in the range of 6 volts to 50 volts, or in the range of 7 volts to 40 volts, or in the range of 8 volts to 30 volts, or in the range of 9 volts to 20 volts, or in the range of 10 volts to 15 volts. In some embodiments, the AC component has a frequency of about 1.89 kilohertz (kHz). In some embodiments, the AC component has a frequency in the range of 1 kHz to 2.5 kHz. In some embodiments, the capacitance of the substrate remains substantially uniform up to a 1000 volts DC. As used in this manner, the term "substantially uniform" means that the capacitance does not change by more than 5%, 2% or 1% from 0 volts to 1000 volts.

The capacitance of the circuit can be affected by the distance between the electrodes 521, 522 and the substrate 505. A larger distance between the substrate 505 and electrodes 521, 522 will result in a smaller capacitance value. If a substrate 505 becomes de-chucked, the capacitance will decrease. In some embodiments, the capacitance baseline for the substrate is measured without any chucking voltage, and with a sufficiently high chucking voltage to flatten the wafer. This baseline is used to generate the allowable capacitance ranges for tool operation based on experimental data collection and a judgement-based safety margin. In some embodiments, the capacitance value of the substrate support 500 is monitored and a response signal is generated if the capacitance value changes outside the allowable range. The signal can be any suitable alert or feedback signal known to the skilled artisan including, but not limited to, alerts to the user (e.g., lights, pop-up messages, email messages, SMS messages), automated feedback signals to activate events or responses from other control systems.

In a multi-substrate processing chamber, the capacitance value of each substrate support is independent of the other substrate supports. For example, referring to FIG. 2, the capacitance value of the substrate on the left support surface 231 is independent of the capacitance value of the substrate on the right support surface 231, and each of these substrates can be monitored independently.

Measuring the capacitance of the substrate on the individual substrate support 500 provides information about the chucking state of the substrate. For example, during rapid movements of the support assembly, the substrate can shift and de-chuck. The capacitance change resulting from this event will indicate a loss of chucking.

In some embodiments, the capacitance sensor provides information to the user or system if the substrate has a sufficient bow (greater than about 0.2 mm). When the substrate is bowed less than about 0.2 mm, the capacitance sensor of some embodiments will indicate proper chucking. In this case, the system would measure a capacitance value that is lower than expected. The system can be designed to increase the DC chucking voltage—either in incremental steps, or by continuously ramping it—until the capacitance value comes into the expected range, as a result of the bowed wafer being chucked flat at the higher voltage.

Figure 8:
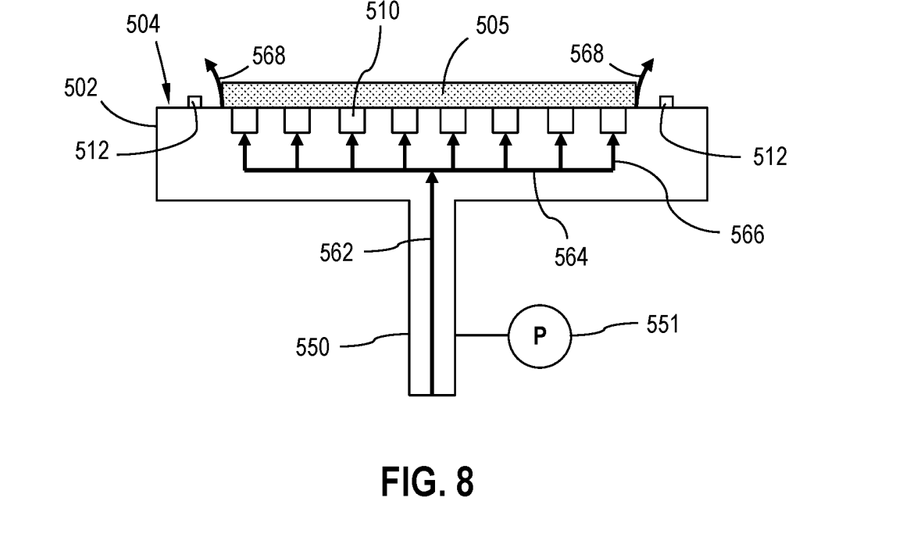
FIG. 8 is a partial cross-sectional schematic view of a backside purge gas flow through a substrate support according to one or more embodiment of the disclosure.
Figure 9:
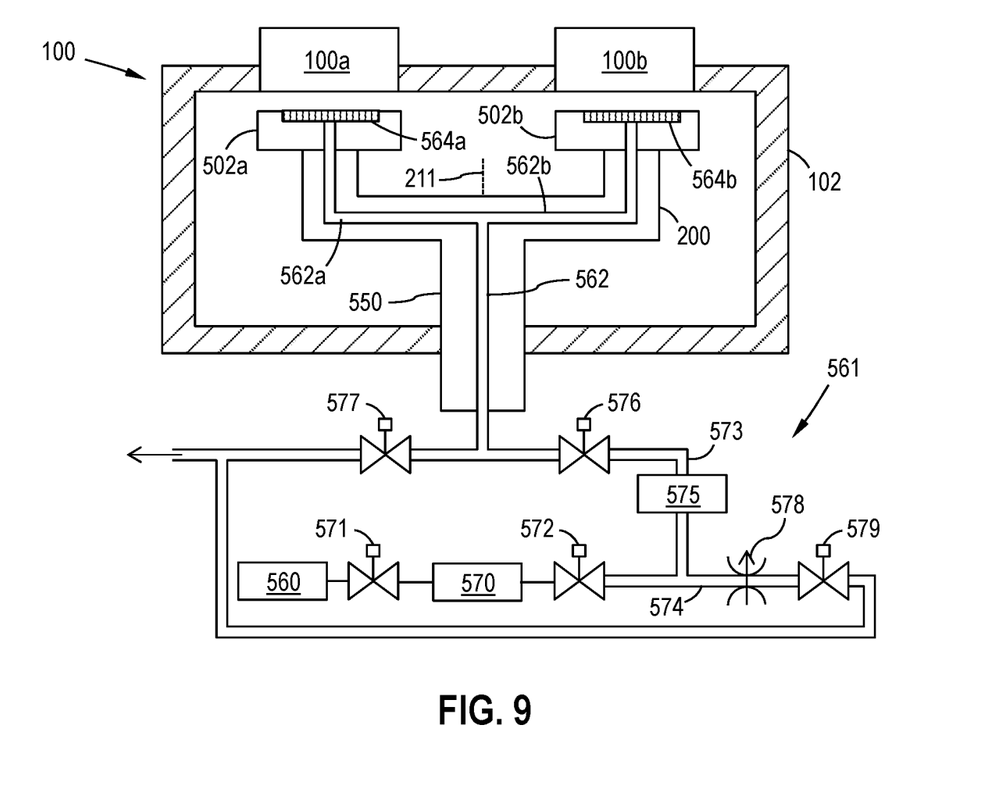
FIG. 9 is a schematic cross-sectional view of a processing chamber and backside pressure flow control system according to one or more embodiment of the disclosure.

Referring to FIGS. 6, 8 and 9, some embodiments of the disclosure include a backside purge with a known or controlled purge pressure. In some embodiments, helium (He) or some other inert/purge gas is flowed to the back of the substrate 505 through the purge line 562. FIG. 8 shows a schematic representation of the substrate support 500 with a backside gas flow indicated with bold arrows. The arrows indicate one possible arrangement of gas lines and flow path through the substrate support and should not be taken as limiting the scope of the disclosure. The skilled artisan will understand how to provide a backside flow of purge gas.

The purge gas enters the body 502 of the substrate support 500 through the support post 550 flowing along purge line 562, splitting to one or multiple flows at the second leg 564 and entering the purge channels 510 through openings 566. Once at the back side of the substrate 505, the gas flows outward toward the outer peripheral edge of the substrate and leaks 568 out past the seal band 512. In some embodiments, a pressure gauge 551 is positioned along the flow path of the purge gas and the pressure in the purge line 562 is controlled by increasing or decreasing the purge flow to meet a pressure setpoint. A calibration curve for the backside purge flow rate is built as a function of the pressure setpoint, and other relvant process parameters as necessary. The leak rate is a parameter that can then be calculated as a difference of the real flow rate needed to maintain the purge pressure, with respect to the expected flowrate from the calibration curve. If the wafer is chucked flat, there is no leak expected across the seal band and the calculated leak rate should be zero sccm (standard cubic centimeters per minute).

In some embodiments, the controller 590 is configured to measure the gas pressure in the purge line 562. In some embodiments, a difference in pressure between the purge line 562 and the process chamber can be monitored to determine if there is an expected differential to allow a sufficient supply of backside gas to pass through the seal band 512. If the substrate de-chucks during processing, the pressure in the purge line 562 will drop.

In some embodiments, a mass flow controller (MFC) is used to control the backside pressure. When the MFC is continuously flowing, the flow to the substrate is about zero as the leak rate across the seal band is about zero if the wafer is well chucked. All the flow from the MFC, in theory, goes to the foreline through the bleed valve 579 (see FIG. 9). The pressure is controlled by changing the flow and the flow is checked against a calibrated flow to determine leakage.

Stated differently, in some embodiments, monitoring is based on leakage rather than pressure. If the wafer is not well chucked, then the seal band will leak, and the flow needed to maintain a certain pressure will be higher, and the leakrate will be non-zero and we can set a threshold at which we generate some kind of event or alarm.

The embodiment in FIG. 8 is based on pressure, not leakage. Because there is no bleed path, the channels are charged with some flow to maintain a certain pressure. The flow rate should be near zero if the wafer is well chucked (and there will be no leak to calculate). If the wafer does get dechucked, then the pressure will drop. The skilled artisan will recognize that the illustrated control system is a schematic and will understand that a full system would be more complex because the FLOW will be near the noise level.

In some embodiments, the controller is connected to the purge line 562 and or the purge gas source 560 and is configured to measure a flow rate of purge gas through the purge line 562 to the back side of a substrate on the support surface 504. The flow rate of the purge gas in the purge line 562 can be measured through any suitable technique known to the skilled artisan, including, but not limited to, a mass flow controller. In some embodiments, the leak rate of the backside purge gas through/past the seal band is less than or equal to 0.2 sccm (standard cubic centimeters per minute), or less than or equal to 0.15, or less than or equal to 0.1 sccm.

FIG. 9 illustrates a schematic of a purge gas source 560 including a backside purge system 561 according to one or more embodiment of the disclosure. In the illustrated embodiment, a purge gas source 560 is connected to an inlet of a mass flow controller (MFC) 570 through an valve 571. Exiting the MFC 570, the purge gas flows through outlet valve 572 and to a junction with a purge flow leg 573 going to the processing chamber 100 and an exhaust leg 574 going to an exhaust system. The gas flowing through the purge flow leg 573 passes through a pressure transducer 575 and a control valve 576 before flowing into purge line 562 or passing through dump valve 577 to exhaust. In the exhaust leg 574, the gas passes through an optional variable orifice 578 and a bleed valve 579 to exhaust.

The embodiment illustrated in FIG. 9 is a batch processing chamber 100 with two visible process stations 100a, 100b. The purge line 562 passes through the support post 550, splitting in a first purge line 562a going to a first substrate support body 502a with a first substrate support body second leg 564a, and in a second purge line 562b going to a second substrate support body 502b with a second substrate support body second leg 564b. In some embodiments, a pressure transducer 575 is used to control the pressure in the purge line 562 by means of a software or hardware control loop, or a combination thereof, which regulates the purge flow rate in that channel. In some embodiments, the pressure in the purge line 562 is controlled relative to the pressure in the process chamber 100.

Figure 10:
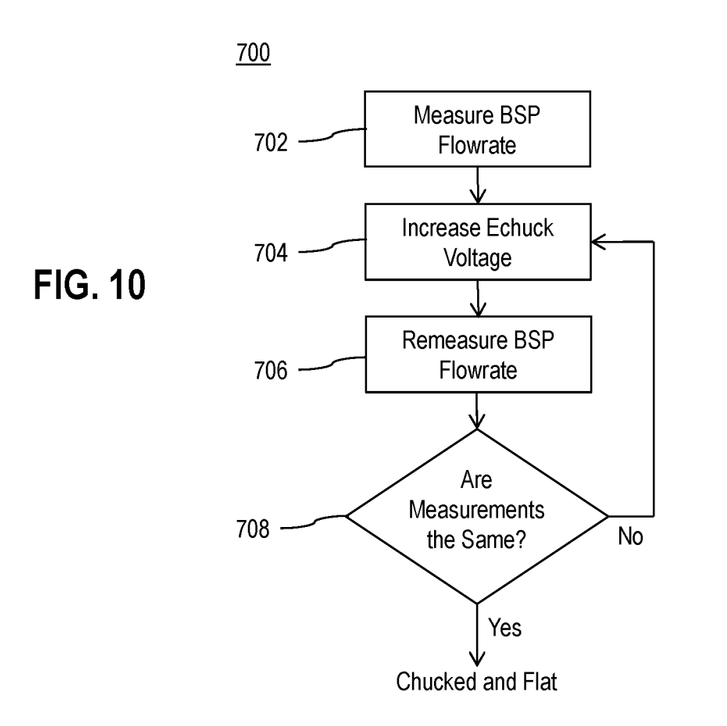
FIG. 10 is a flowchart for a method of determining if a substrate is chucked and flat according to one or more embodiment of the disclosure.

In some embodiments, the controller 590 is configured to determine if the substrate is flat and chucked by correlating changes in the capacitance with an increase in the flow rate of the purge gas to the back side of the substrate. FIG. 10 shows a flowchart for a method 700 of determining whether a substrate is chucked and flat. At operation 702, the backside pressure leak rate is measured. The echuck potential and/or current is modified to increase chucking force at operation 704. The backside pressure leak rate is re-measured at operation 706. At query 708, the leak rates from operation 702 and operation 706 are compared. If the leak rates remain substantially the same, the substrate is flat and chucked. If the leak rate decreases, the substrate was not flat and chucked and operation 704 through query 708 are repeated until the leak rates are the same.

Figure 11:
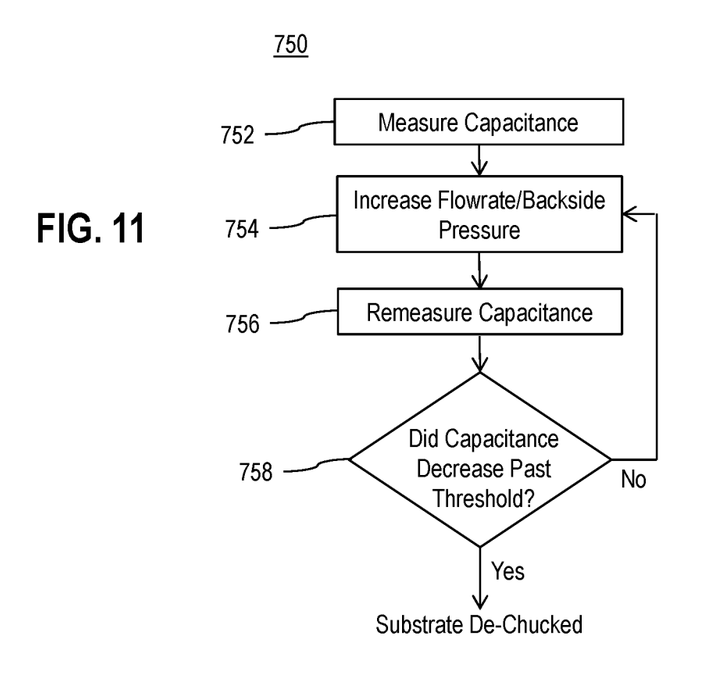
FIG. 11 is a flowchart for a method of determining if a substrate has de-chucked according to one or more embodiment of the disclosure.

FIG. 11 illustrates a flowchart for a method 750 of determining chucking strength. At operation 752, the capacitance of the substrate on the support surface is measured. The flow rate/backside pressure is increased at operation 754. The capacitance of the substrate on the support surface is re-measured at operation 756. At query 758, the capacitances are compared. If the capacitance decreases beyond a predetermined threshold, the substrate has de-chucked, otherwise operations 754 through query 58 are repeated until the substrate has de-chucked. Additionally if the substrate has dechucked, the backside purge leak rate also is higher than expected.

In some embodiments, the controller 590 is configured to monitor the substrates in the batch processing chamber to alert for de-chucking. During operation, the substrate support assembly rotates quickly between processing stations. If a substrate becomes de-chucked, the pressure transducer will observe a decrease in backside pressure and/or increase in flow rate indicating that one of the substrates is leaking more backside purge gas than expected. The flow rate change can identify when a substrate has de-chucked, but cannot pinpoint which substrate or substrates has de-chucked. In some embodiments, once a de-chucking event has been observed, the capacitance of the substrates is measured and compared to a baseline value. Whichever substrate(s) capacitance decreased beyond a predetermined threshold has become de-chucked.

In some embodiments, the health of the electrostatic chuck is checked prior to loading a substrate onto the substrate support, by checking the capacitance of the substrate support. In the case of process chambers flowing precursors which can form a conductive film, insufficient post-process purge-out of precursors can lead to residual chemistry in the chamber which can deposit on the electrostatic chuck and result in a conductive film which can degrade chucking. This conductive film results in a higher capacitance readout than expected, which can be used to generate an alarm or event to prevent loading more substrates and avoid a potential wafer dechuck scenario.

In some embodiments, the health of the electrostatic chuck is checked after loading a substrate onto the substrate support and chucking the substrate. If the process is intended to run at a certain backside pressure, a software sequence is executed where the substrate backside is briefly pressurized to higher than the process conditions, and held for a determined period of time before lowering it to the process conditions. The higher pressure and the period of time are determined from experimentation and statistical data analysis, and appropriate engineering judgement. During this period of time, the capacitance and the leak rate are monitored to ensure they stay in their respective expected ranges. If this check passes, process can continue. This helps reduce the risk of wafer dechucking during high velocity moves.

In some embodiments, the controller 590 is connected to the at least one heating element 540 and is configured to control power to the at least one heating element 540. In some embodiments, the controller 590 is connected to a temperature sensor (e.g., pyrometer, thermocouple, etc.) to measure the temperature of a substrate or of the substrate support 500 and to change the power to the heating element 540 to maintain a predetermined temperature.

Referring back to FIGS. 1, 2 and 9, one or more embodiments of the disclosure are directed to substrate support assemblies 200. The substrate support assembly comprises a central hub 202 rotatable around a rotational axis 211. A plurality of substrate supports 500 are positioned at a distance from the rotational axis 211. The substrate supports 500 are any of the embodiments or combination of embodiments described herein for each of the substrate supports independently.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A substrate support comprising:
    a body having a support surface and a bottom surface, the distance between the support surface and bottom surface defining a thickness of the body, the support surface having a plurality of purge channels extending a distance into the body, the plurality of purge channels bounded by a seal band, the body including at least two electrodes configured to electrostatically chuck a substrate to the support surface;
    a support post connected to the bottom surface of the body;
    a purge line in fluid communication with the purge channels;
    a power supply connected to the electrodes; and
    a controller connected to the electrodes and configured to continuously measure capacitance of a substrate on the support surface throughout processing and stop the processing upon a change in capacitance above a threshold value.

2. The substrate support of claim 1, wherein the power supply is configured to provide high voltage direct current (DC) and a low voltage alternating current (AC) component to the electrodes.

3. The substrate support of claim 1, wherein the controller is connected to the purge line and configured to measure a flow rate of purge gas through the purge line to the back side of a substrate on the support surface.

4. The substrate support of claim 3, wherein the controller is configured to determine if the substrate is flat and chucked by correlating changes in the capacitance with an increase in the flow rate of the purge gas to the back side of the substrate.

5. The substrate support of claim 1, wherein the body further comprises at least one heating element within the thickness of the body.

6. The substrate support of claim 5, wherein the controller is connected to the at least one heating element and configured to control power to the at least one heating element.

7. A substrate support assembly comprising:
    a central hub rotatable around a rotational axis;
    a plurality of substrate supports positioned at a distance from the rotational axis, each of the substrate supports comprising:
        a body having a support surface and a bottom surface, the distance between the support surface and bottom surface defining a thickness of the body, the support surface having a plurality of purge channels extending a distance into the body, the plurality of purge channels bounded by a seal band, the body including at least two electrodes configured to electrostatically chuck a substrate to the support surface;
        a support post connected to the bottom surface of the body;
        a purge line in fluid communication with the purge channels;
        a power supply connected to the electrodes; and
        a controller connected to the electrodes and configured to continuously measure capacitance of a substrate on the support surface throughout processing and stop of the processing upon a change in capacitance above a threshold value.

8. The substrate support assembly of claim 7, wherein each power supply is configured to provide high voltage direct current (DC) and a low voltage alternating current (AC) component to the electrodes.

9. The substrate support assembly of claim 7, wherein the controller is connected to the purge line and configured to measure a flow rate of purge gas through the purge line to the back side of a substrate on the support surface.

10. The substrate support assembly of claim 9, wherein the controller is configured to determine if the substrate is flat and chucked by correlating changes in the capacitance with an increase in the flow rate of the purge gas to the back side of the substrate.

11. The substrate support assembly of claim 7, wherein the body of each of the substrate supports further comprises at least one heating element within the thickness of the body.

12. The substrate support assembly of claim 11, wherein the controller is connected to the at least one heating element and configured to control power to the at least one heating element.

13. The substrate support assembly of claim 7, wherein there are three or four substrate supports connected to the central hub.

14. A processing method comprising:
providing a flow of purge gas into a plurality of purge channel formed in a support surface of a body of a substrate support, the plurality of purge channels bounded by a seal band, the substrate support having a substrate positioned thereon and the flow of gas leaking through the seal band;
polarizing at least two electrodes formed in the body of the substrate support so that there is a voltage differential between the at least two electrodes to electrostatically chuck the substrate to the support surface; and
measuring a capacitance of the substrate on the substrate support to determine whether the substrate is chucked, wherein the substrate is processed and the capacitance of a substrate on the support surface is continuously measured, and the processing is stopped when a change in capacitance above a threshold value is reached.

15. The method of claim 14, wherein polarizing the at least two electrodes comprises providing power from a power supply configured to provide high voltage direct current (DC) and a low voltage alternating current (AC) component to the electrodes.

16. The method of claim 14, increasing the flow of purge gas to the back side of the substrate and measuring the capacitance of the substrate to determine if the substrate is flat and chucked to the support surface.

17. The method of claim 14, wherein there are a plurality of substrate supports positioned around a rotational axis of a substrate support assembly, each of the substrate supports having a plurality of purge gas channels and electrodes, and a capacitance of each substrate on the support surfaces is monitored throughout a deposition process to determine if a substrate becomes de-chucked.

* * * * *